United States Patent [19]

Menichelli

[11] Patent Number: 5,831,469
[45] Date of Patent: Nov. 3, 1998

[54] MULTIPLIER IMPROVED VOLTAGE

[75] Inventor: Stefano Menichelli, Rome, Italy

[73] Assignee: Texas Instruments Incorporated, Dallas, Tex.

[21] Appl. No.: 576,281

[22] Filed: Dec. 21, 1995

[51] Int. Cl.⁶ .................................................. H02M 7/42
[52] U.S. Cl. .............................. 327/536; 363/59; 363/60; 307/110
[58] Field of Search .................................. 327/536, 148, 327/157; 363/59, 60; 307/110

[56] References Cited

U.S. PATENT DOCUMENTS

| | | | |
|---|---|---|---|
| 4,807,104 | 2/1989 | Floyd et al. | 363/59 |
| 5,051,881 | 9/1991 | Herold | 363/59 |
| 5,095,223 | 3/1992 | Thomas | 307/110 |
| 5,111,375 | 5/1992 | Marshall | 363/59 |
| 5,132,895 | 7/1992 | Kase | 363/59 |
| 5,481,447 | 1/1996 | Caris et al. | 327/536 |
| 5,581,454 | 12/1996 | Collins | 363/59 |

*Primary Examiner*—Timothy P. Callahan
*Assistant Examiner*—Kenneth B. Wells
*Attorney, Agent, or Firm*—Robby T. Holland; Richard L. Donaldson

[57] ABSTRACT

An on-chip voltage multiplier circuit, comprising N serially arranged stages wherein each stage includes a switch $T_j$ (j=1 ... N), having an upper pin and a lower pin, to the upper pin of which the lower pin of a capacitor $C_i$ (i=1 ... N) is serially connected, said capacitor also having a lower pin and an upper pin; the intermediate node between each switch $T_j$ (j=1 ... N) and each capacitor $C_i$ (i=1 ... N) is connected to the ground voltage Vss through a respective switch $S_i$ (i=1 ... N) and the upper pin of each capacitor $C_i$ (i=1 ... N) is connected to the supply voltage Vdd through a switch $D_i$ (i=1 ... N); and the lower pin of the switch (T11) of the first stage is directly connected to the supply voltage Vdd and the upper pin of the capacitor (CN) of the last stage is connected to the output pin through an additional switch (T(N+1)).

4 Claims, 8 Drawing Sheets

MULTIPLIER IMPROVED VOLTAGE

FIELD OF INVENTION

This invention broadly relates to semiconductor memories and, more particularly, it relates to a novel implementation of a voltage multiplier circuit.

BACKGROUND OF THE INVENTION

It is well known, for instance, that, in addition to said conventional supply voltages of 5.0 or 3.3 volts, also higher voltages, that can be of 12 volts or even 18 volts, in certain circumstances are utilized in order to carry out programming or deleting operations on the memory cells. It is apparent that these memories, therefore, need an additional supply source, which is rather problematic, in the first place, due to the fact that the need to provide for two supply sources rather than simply one certainly is disadvantageous. The problem, therefore, is that a voltage higher than the supply voltage is to be provided on the chip.

This requirement has been satisfied at the present state of the art by utilizing particular approaches defined as "charge pumps" or by means of capacitor arrangements in "bootstrap" pattern, wherein the capacitors are charged in parallel and then are switched in series, so that the energy stored therein is utilized to raise the voltage.

The main drawback of this approach is that, when the load is increased, a voltage collapse occurs as a consequence of the fact that of course, the situation is far from an ideal current generator.

Figure 1:
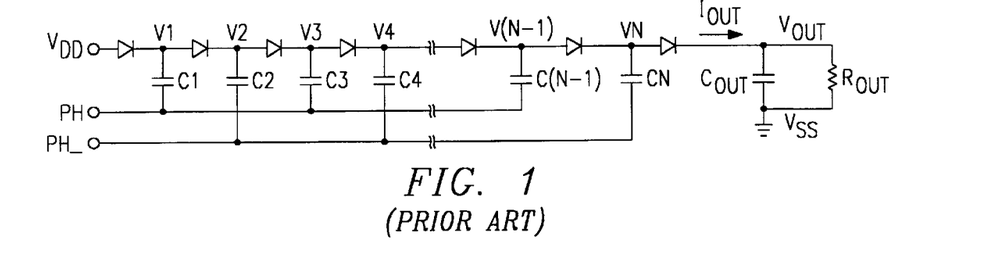
FIG. 1 is a prior art drawing illustrating a Dickson voltage multiplier circuit with diodes.

Most voltage multiplier circuits are based upon the diagram of prior art FIG. 1, which comprises two sets of parallel connected capacitors, driven by two phase signals PH and PH, connected to and interdigitated with a serial diode chain, from the last of which the output current Iout is drawn at the desired voltage. Since diodes are not available in standard CMOS technology, a practical implementation of this circuit utilizes MOS transistors connected so as to operate as diodes. This high voltage generator directly incorporated with the chip (on-chip) was proposed by John Dickson in 1976 and it is basically derived from the Cockroft-Walton voltage multiplier. In the circuit shown in prior art FIG. 1, charge packets are pumped along the diode chain as the coupling capacitors are successively charged and discharged under action of the two clock signals PH and PHthat are in antiphase relationship, with amplitude Vdd.

Assuming that the diodes are ideal, that the capacitors Ci (i=1 ... N) have the same value and that the circuit is settled to the desired output voltage Vout with a constant average load current Iout, the following formulas apply:

$$\text{power efficiency} = Vout/[Vdd*(N+1)] \quad (1)$$

$$N = \{(VNmax - 2*Vdd)/[Vdd - (VNmax - Vout)]\} + 1 \quad (2)$$

wherein VNmax is the maximum voltage at the node VN before capacitor Cn discharges to the output.

Formula (1) means that the multiplication efficiency and the power efficiency, that is the ratio between the output power and the total supplied power, express the same concept. Normally, the diodes are replaced by N-channel MOS transistors connected to operate as diodes. P-channel transistors are not used because of difficulties associated with the substrate bias and with turning the devices off. Due to the poor capability of the N-channel MOS transistors to efficiently switch high voltage levels, the multiplication efficiency and the load current drive capability are both noticeably degraded with respect to the diode implementation. For example, a typical MOS transistor charge pump implementation for generating a voltage of 18 volt from a 5 volt power supply has almost twice the stages needed for an equivalent diode implementation.

SUMMARY OF INVENTION

DETAILED DESCRIPTION OF PREFERRED EMBODIMENT

Figure 2A:
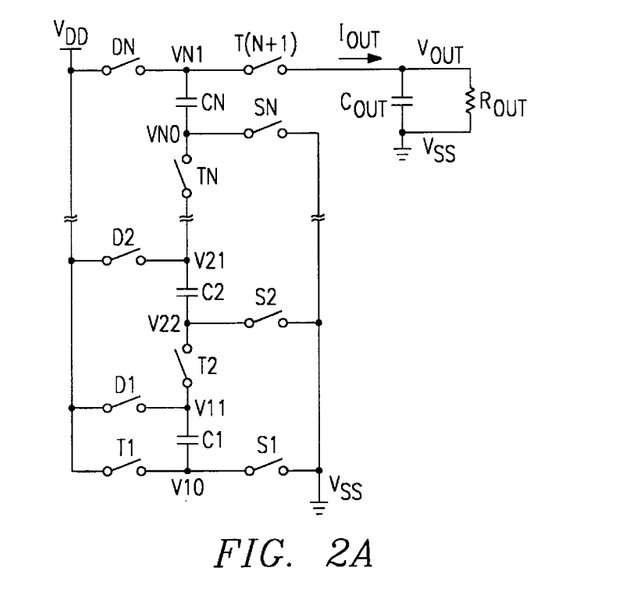
FIG. 2 shows a conceptual electric diagram of a voltage multuplier according to this invention, together with its related timing diagrams.
Figure 2B:
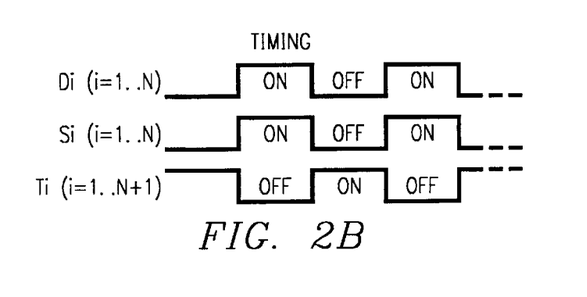

In order to overcome the above drawbacks, a first aspect of this invention suggests a novel technique for realizing a voltage multiplier circuit, a conceptual electric diagram together with its related timings is shown in FIG. 2.

As it can be seen from FIG. 2, a number of serially arranged capacitors Ci (i=1, ... N) are provided interdigitated with a set of switches Tj (j=2 ... N), the end and intermediate nodes of which are coupled to the supply voltage Vdd by means of a set of switches Tl and Di (i=1 ... N) and to ground by means of a set of switches Si (i=1 ... N), the output current being drawn from the last capacitor CN by means of a further switch T (N+1).

The circuit operates by using a clock signal PH to turn on and off the switches Di, Si and Tj (i=1 ... N; j=1 ... N+1). Each capacitor Ci is charged to voltage Vdd directly by the power supply Vdd when switches Di and Si are on and switches Tj are off. In the next clock signal phase, switches Di and Si turn off and the switches Tj turn on. In such switching arrangement capacitors Ci are connected in series and are discharged directly to the output.

The minimum number N of capacitors should be used to exceed, by a reasonable value ΔV, the desired output voltage Vout. Assuming that capacitors Ci have the same capacitance value C and that F is the PH clock signal frequency and that the circuit is settled to the desired output voltage Vout with a constant average load current Iout, the following formulas apply:

$$\Delta V = Vdd*(N+1) - Vout \quad (3)$$

$$Iout = \Delta V * C * F / N \quad (4)$$

As concerns the power efficiency, formula (1) is still valid. Since the value of N is equal, or almost equal, to the theoretical minimum value also in a practical implementation, the new voltage multiplier is suitable for low power applications, such as in circuits with battery power supplies.

Since the voltage across the switches Tj (j=1 ... N) varies from 0 volts to Vdd and never changes in sign, these switches can be implemented with P-channel MOS transistors. Since a different bias configuration exists for switch T(N+1) as well as for switches Di, N-channel MOS transistors are used to accomplish the function of switches Di, Si and T (N+1).

Figure 3:
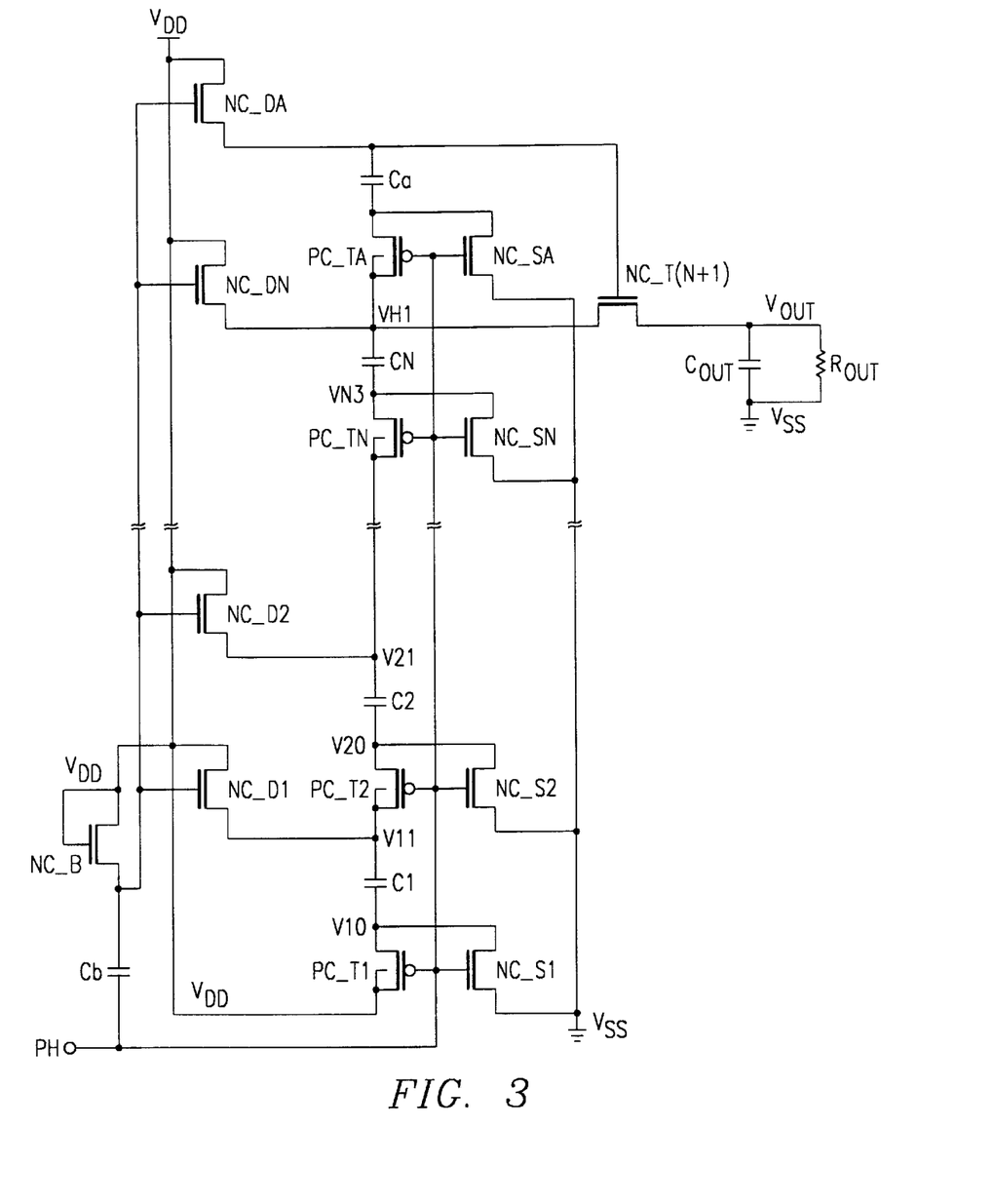
FIG. 3 shows a circuit implementation with MOS transistors of the conceptual diagrm of FIG. 2.

A first practical implementation of the conceptual scheme of FIG. 2 is shown in FIG. 3. A bootstrap technique has been used to properly drive the gates of the N-channel MOS transistors whose sources are not at Vss potential.

The transistors NCDi (i=1 ... N) (N-channel MOS transistors) as employed for implementing switches Di of FIG. 2, are switched by a voltage doubler, which is made by capacitor Cb and by transistor NCB, connected as a diode. As it can be observed, capacitor Cb is inserted between the clock signal source PH and the gates of all transistors NC Di, while the diode transistor NCB is inserted between said capacitor Cb and the voltage supply Vdd.

As it can be observed, the circuit can be ideally considered as divided into stages the components of which are all connected in analogous way. By considering the first stage (C1, T1, S1, D1 in FIG. 2 and Cl, PCS1, NCD1 in FIG. 3) it can be seen that transistor PCT1 is inserted between voltage Vdd and node V10 for coupling or connection to a first terminal (lower pin) of capacitor Cl and it has its gate coupled or connected to the gate of transistor NCS1. This latter transistor is inserted with its source and drain between voltage Vss and said node V10. Transistor NCD1 is inserted between a second terminal (upper pin) of capacitor Cl and voltage Vdd and it has its gate driven by phase signal PH through capacitor Cb.

As far as output transistor T(N+1) of FIG. 2 is concerned, by referring to FIG. 3 it can be observed that it is realized by an NMOS transistor designated NCT(N+1) inserted between the upper pin of capacitor CN of the last stage and the output and it has its gate pin driven by the upper pin of capacitor Ca of a supplementary stage.

In fact, aiming at efficiently switching transistor NC T(N+1) which is employed to implement switch T(N+1) of FIG. 2, a small stage has been added to the top of the structure, comprising an NMOS type transistor NCDA, a capacitor Ca, a PMOS type transistor PCTA as well as a transistor NCSA, analogously connected as in the previous stages. The dimensions of transistors NCDA, PCTA and NC SA as well as the Ca capacitance value are smaller than those of the corresponding components of the other N stages.

Since this circuit enables the capacitors Ci(i=1 ... N) to be fully charged to Vdd and directly discharged to the output, the load current drive capability is improved with respect to a standard charge pump of equivalent implementation. Moreover, it should be noted that, in contrast with the circuit of FIG. 1, the maximum voltage across each capacitor (except the output capacitor Cout) is only equal to the supply voltage Vdd.

Figure 4:
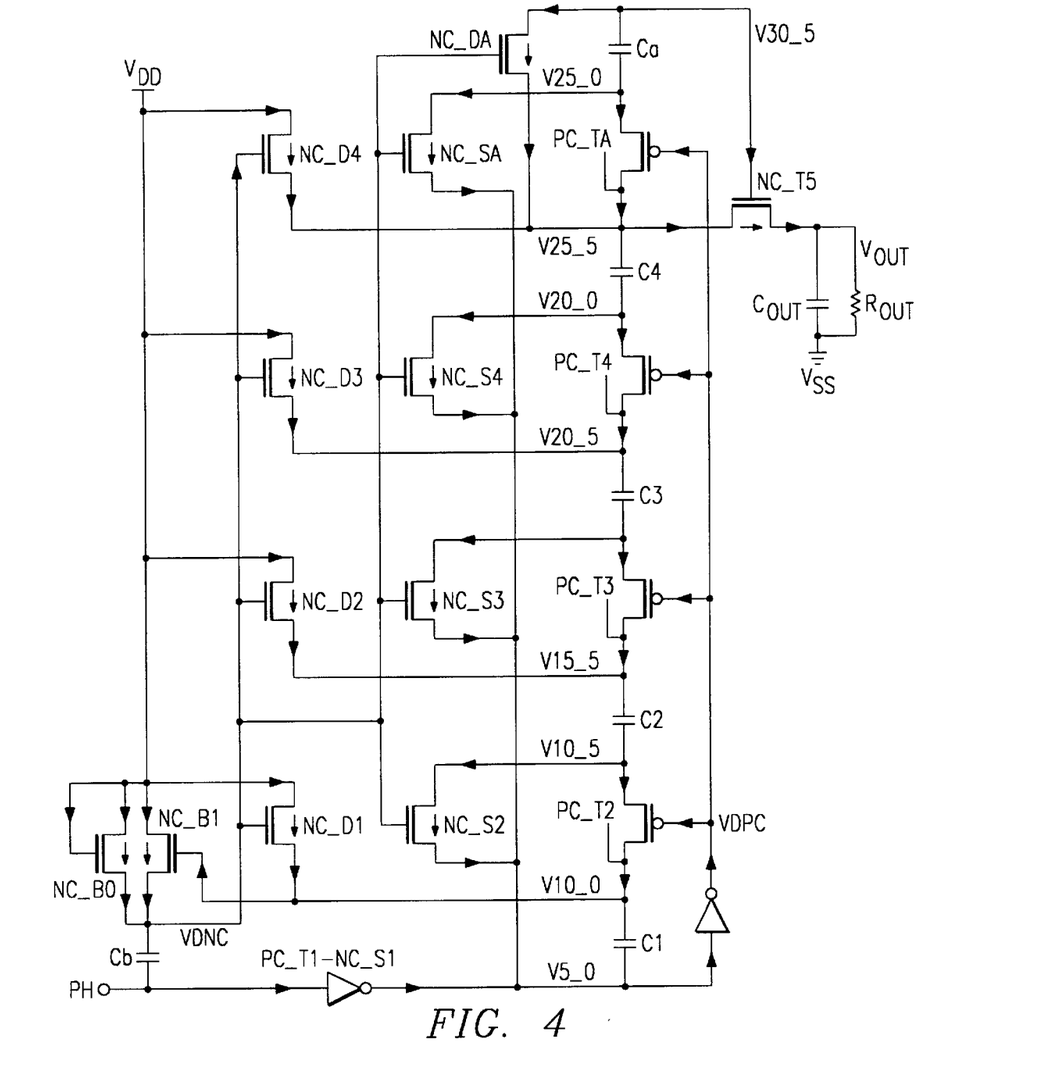
FIG. 4 shows a detailed circuit implementation of the voltage multiplier according to this invention.

In order to achieve a higher efficiency, some electrical engineering improvements can be made in the circuitry of FIG. 3. Finally, the definitive scheme of a four-stage voltage multiplier circuit is shown in FIG. 4. Some connections have been reviewed and rearranged to reduce the voltage stress across the gate oxide of transistors NCSA, NCS4, NCS3 and NCS2 as well as to decrease their sizes. On the other side, the sizes of the transistors should be kept as low as possible, in order to reduce the parasitic capacitance effects on the high-voltage nodes.

Transistor NCDA provides a path to charge capacitor Ca and at the same time it enables transistor NCT5 to be quickly and surely turned off at the begin of the charging phase. In the front section of the circuit, a further NMOS type transistor NCB1, also inserted with its source and drain pins between capacitor Cb and voltage Vdd, but having its base driven by the voltage of the upper pin of capacitor Cl of the first stage, has been added in parallel to transistor NCB of FIG. 3 (designated as NCB0 in FIG. 4), in order to fully charge capacitor Cb, thereby off-setting the threshold drop occurring across diode transistor NCB0.

The voltage stress establishing across the gate oxide of the Pchannel transistors located in the upper section of the circuit may be easily reduced by coupling their gates directly to Vdd or to a lower high-voltage node. For example, the gate pin of transistor PCTA could be coupled to voltage Vdd or to the node V105 or to V155. Node V205 should not be used because in such case there would be a voltage less than 5 volt to turn on the transistor PCTA.

Such a connection change does not affect the electrical functionality of the circuit. However, provided that the CMOS integrated circuit process limits are not exceeded, the gate pins of the P-Channel transistors should be coupled to node VDPC (drive of P-channel transistors), as shown in FIG. 4, in order to decrease the sizes of these transistors and at the same time to drive them into a deep conduction state during the discharge phase. If a connection change is required, the gate pin of the P-channel transistors is preferably coupled to voltage Vdd.

The highest voltage within this voltage multiplier circuit is directly related to the output voltage Vout. The output voltage should not be allowed to exceed the required output voltage. For example, if the output current Iout is low or null and/or the supply voltage accidentally increases above the normal range, the voltages in the upper section of the circuit, namely in its final stages, may exceed the process limits, thereby resulting into consequences that those skilled in the art can easily understand.

Figure 5:
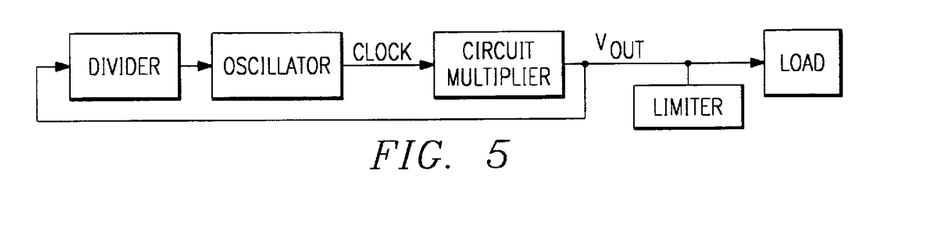
FIG. 5 shows a block diagram of a high voltage generator.

A practical high-voltage generator implementation scheme based upon the teachings up to now described is shown in FIG. 5. Referring to FIG. 5, it can be observed that an output voltage Vout limiter has been inserted between the voltage multiplier circuit and the load, in order to prevent dangerous and useless over-voltages within the voltage multiplier circuit. Furthermore, in order to make Vout as stable as possible, a feedback loop has been realized around the voltage multiplier circuit, comprising a voltage divider circuit and a voltage controlled oscillator (VCO) by which the clock signal is provided to the input of the voltage multiplier circuit.

According to formulas (3) and (4), the variation of the output voltage Vout due to a variation of the output current Iout may be minimized by suitably trimming the clock frequency F. The output current Iout and the frequency F are related by the simple formula Iout=K*F, where K is assumed, as constant and given by $$\{[Vdd*(N+1)-Voutd]*C\}/N$$

wherein Voutd is the desired output voltage.

If the circuit of FIG. 4 is considered as a "module", a voltage multiplier circuit should be made by two or more modules connected in parallel to the output, provided that they use non-overlapping clock signals, in order to reduce the ripple voltage at the output as well as to increase the load current drive capability.

EXAMPLES

Two examples will now be described, carried out by means of SPICE simulations based upon use of 4 Mb DRAM memories by TEXAS INSTRUMENTS INC.. The SPICE simulations have been carried out using Vss=0 volts and Vbb=-3 volt, with Vpp=5 volt.

EXAMPLE 1

| Data: | Vdd = 5 volt | F = 10 MHz |
|---|---|---|
| Requirements: | Vout = 12 volt | Iout = 1 mA |

Figure 6:
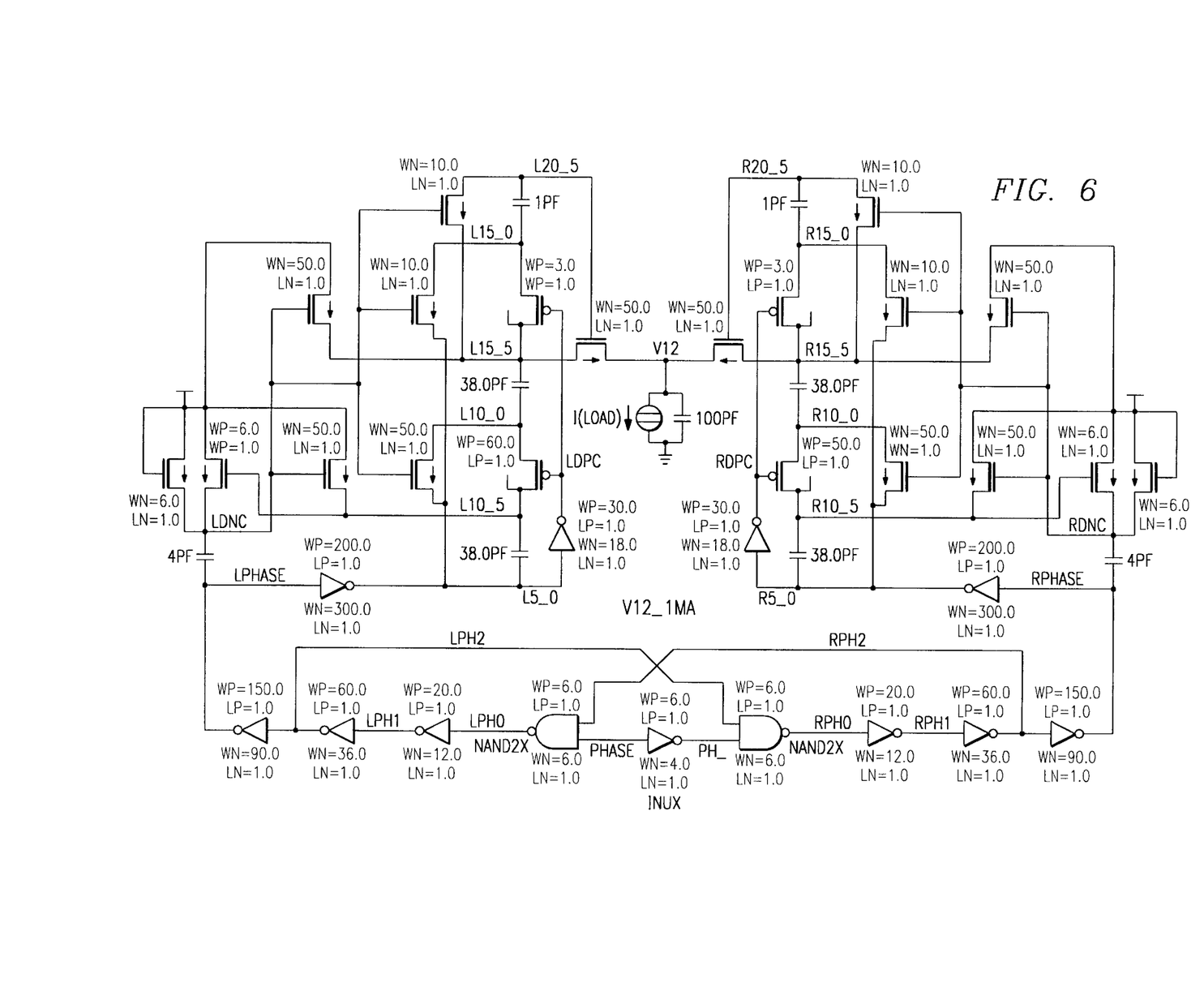
FIG. 6 shows a two-module voltage multiplier circuit.
Figure 7A:
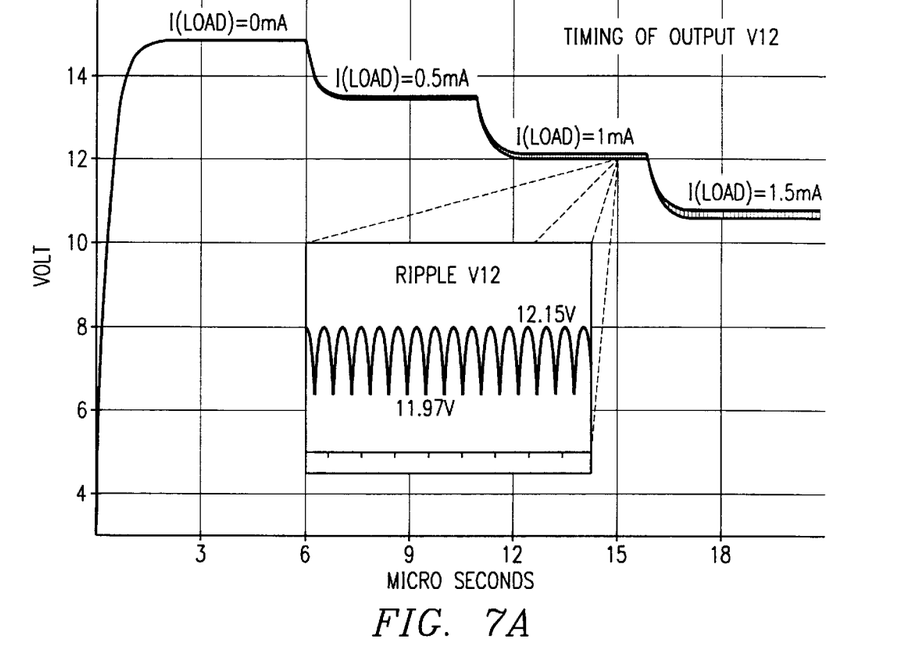
FIG. 7 shows the results of a SPICE simulation on the circuit shown in FIG. 6.
Figure 7B:
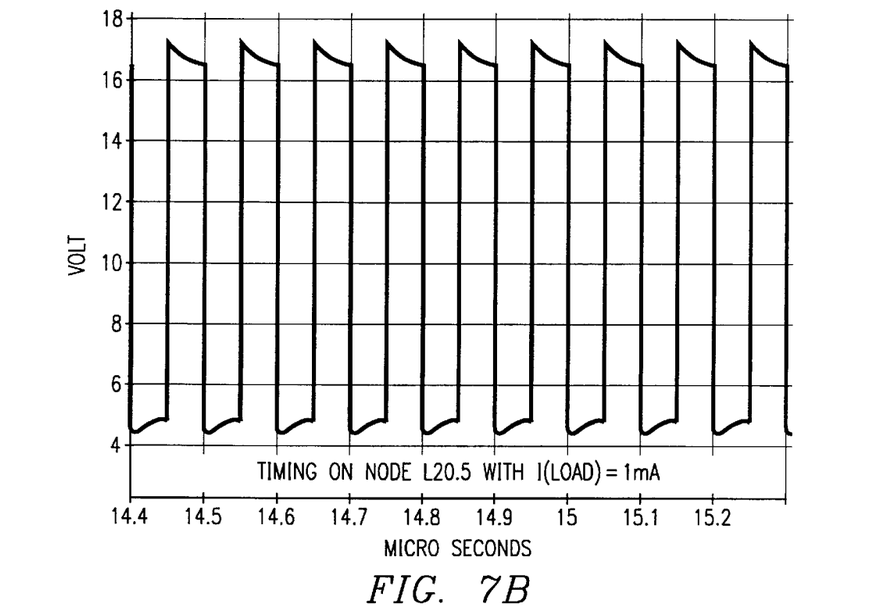

By using formula (3), N has been set to 2 and therefore $\Delta V$ is 3 volt. Two modules have been used to reduce any ripple effects. From formula (4), the capacitance of capacitor C should be (100/3) pF but, taking the transistor capacitance as well as the non-ideal charging and discharging conditions into account, the value of C has been increased by 14% and set to 38.0 pF. The resulting designed voltage multiplier circuit is shown in FIG. 6. SPICE simulation results are shown in FIG. 7. The output impedance, in a large range around the operation point, is practically constant and less than 2900 Ohms.

EXAMPLE 2

| Data: | Vdd = 5 volt | F = 10 MHz |
|---|---|---|
| Requirements: | Vout = 18 volt | Iout = 100 $\mu$A |

Figure 8A:
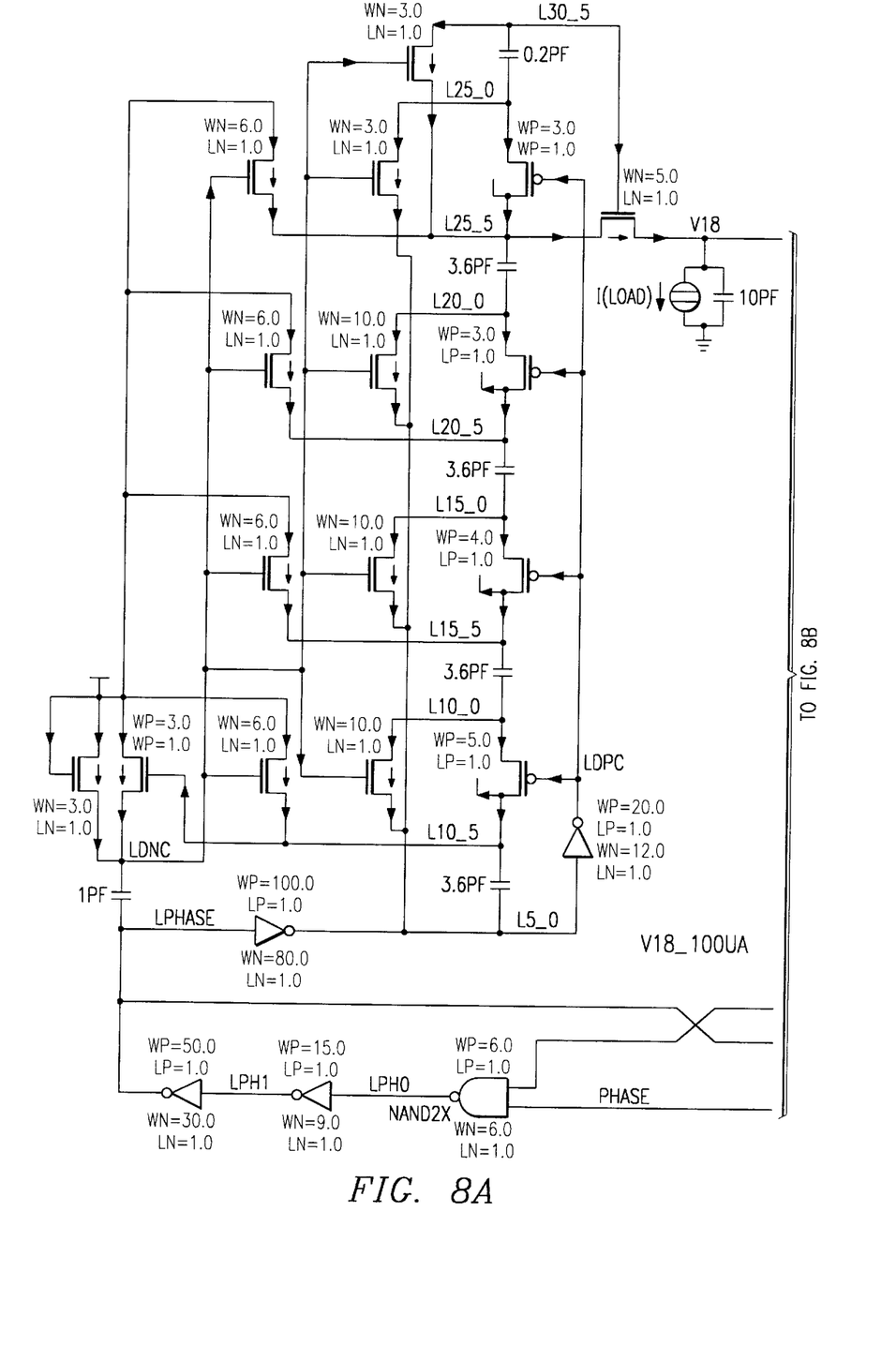
FIG. 8 shows a further two-module, voltage multiplier circuit according to this invention.
Figure 8B:
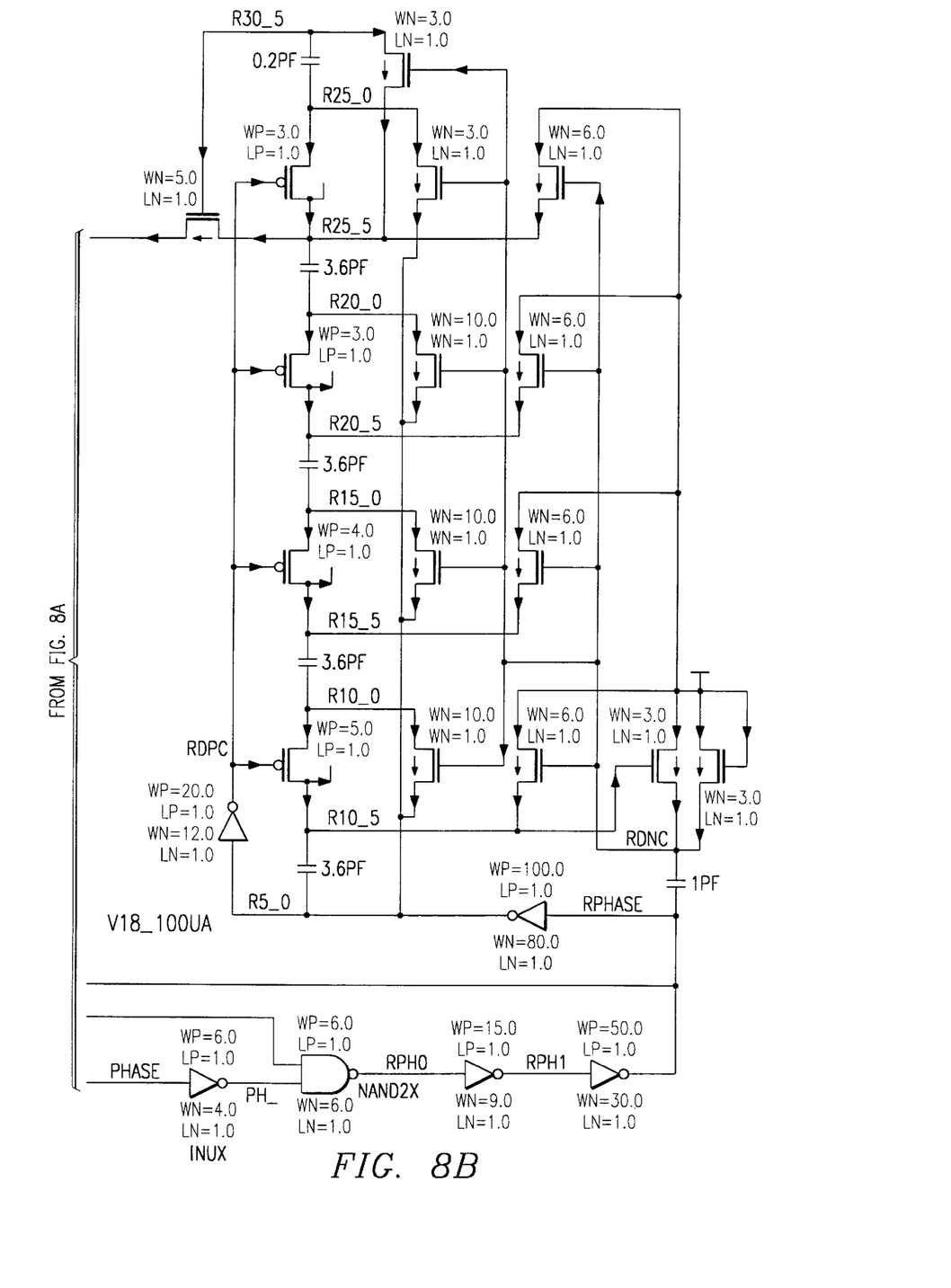
Figure 9A:
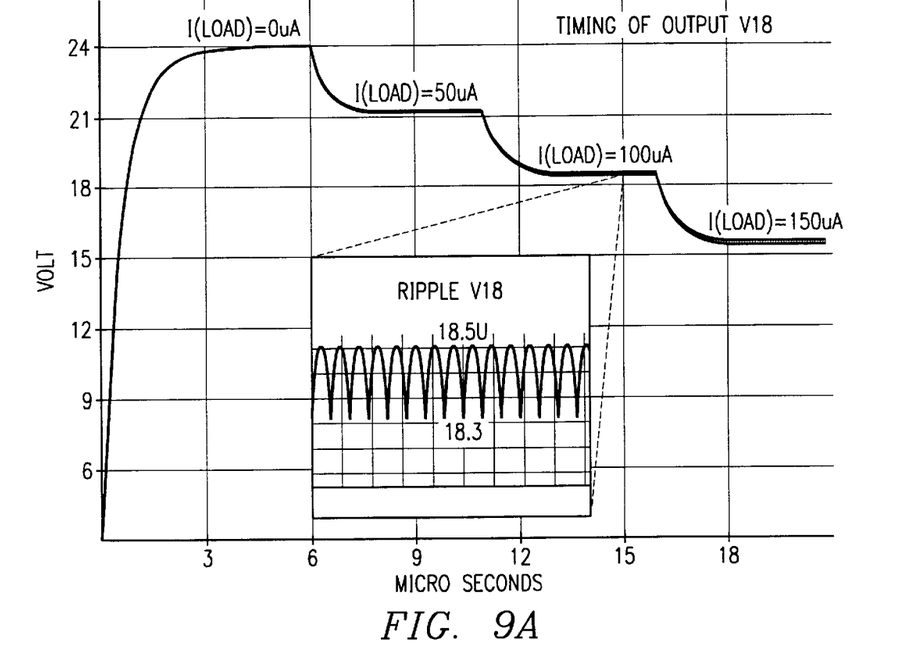
FIG. 9 shows the results of SPICE simulation on the circuit of FIG. 8.
Figure 9B:
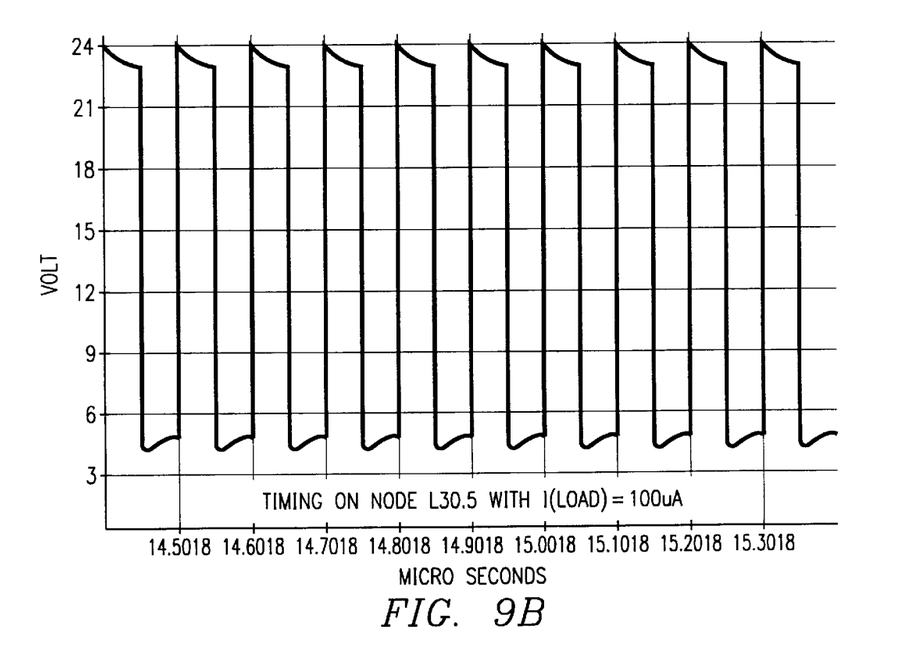

By using formula (3), N has been set to 4 and therefore $\Delta V$ is 7 volt. N=3 is a possible but not recommended value because the tolerance for $\Delta V$ would be too small. For example, should voltage Vdd drop by 10%, the tolerance $\Delta V$ would be reduced to zero. Also in this case, two modules have been used in order to reduce the ripple effects. From formula (4), the capacitance of capacitor C should be 2.86 pF but, taking the transistor capacitance as well as the non ideal charging and discharging conditions into account, the value of C has been increased by 26% and set to 3.6 pF. The correction factor is almost proportional to N. The resulting designed voltage multiplier circuit is shown in FIG. 8. SPICE simulation results are shown in FIG. 9. The output impedance, in a large range around the operation point, is practically constant and less than 59 Kohms.

PARASITIC CAPACITANCE

Assuming that poly-poly capacitors are used, an important aspect of them is the parasitic capacitance associated with each plate. The largest parasitic capacitance is the one existing between the bottom plate and the underlying layer, which is supposed to be an N-well diffusion whose terminal is electrically isolated. To estimate the parasitic capacitance value, the following process data (from the 256 Kb Flash EEPROM 5 volt only) have been used: plate separation= 0.03 $\mu$m; oxide thickness from the bottom plate to the underlying layer=1 $\mu$m. Neglecting the parasitic capacitance associated with the upper plate and taking the effect of the N-well diffusion into account, whose terminal is floating, a parasitic capacitance from the bottom plate to voltage Vss has been added to each capacitor with a value of 2.5% of the capacitance of the capacitor itself.

The SPICE simulation results are summarized below.

Example 1

| Vout = 12 volt | Iout = 1 mA. |
|---|---|

The following lines have been added to the input SPICE deck of the first example:
CL0 L50 VSS 950FF PC
CL1 L100 VSS 950FF PC
CL3 L150 VSS 25FF PC
CR0 R50 VSS 950FF PC
CR1 R100 VSS 950FF PC
CR3 R150 VSS 25FF PC

RESULTS OF SPICE SIMULATIONS
TABLE OF THE OUTPUT VOLTAGES

|  | I(load) | | | |
|---|---|---|---|---|
|  | 0.0 mA | 0.5 mA | 1.0 mA | 1.5 mA |
| Vout values disregarding parasitic capacitances | 14.8 V | 13.5 V | 12.1 V | 10.6 V |
| Vout values with parasitic capacitances included | 14.6 V | 13.3 V | 11.9 V | 10.5 V |
| Output voltage variation | 0.2 V | −0.2 V | −0.2 V | −0.1 V |

Example 2

| Vout = 18 volt | Iout = 100 $\mu$A. |
|---|---|

The following lines have been added to the input SPICE deck of the second example:
CL0 L50 VSS 90FF PC
CL1 L100 VSS 90FF PC
CL2 L150 VSS 90FF PC
CL3 L200 VSS 90FF PC
CL4L250 VSS 5FF PC
CR0 R50 VSS 90FF PC
CR1 R100 VSS 90FF PC
CR2 R150 VSS 90FF PC
CR3 R200 VSS 90FF PC
Ct4R250 VSS 5FF PC

RESULTS OF SPICE SIMULATIONS
TABLE OF THE OUTPUT VOLTAGES

|  | I(load) | | | |
|---|---|---|---|---|
|  | 0.0 $\mu$A | 50 $\mu$A | 100 $\mu$A | 150 $\mu$A |
| Vout values disregarding parasitic capacitances | 24.0 V | 21.2 V | 18.4 V | 15.4 V |
| Vout values with parasitic capacitances included | 22.1 V | 19.5 V | 17.0 V | 14.2 V |
| Output voltage variation | −1.9 V | −1.7 V | −1.4 V | −1.2 V |

The preferred embodiment of this invention has been hereinbefore explained, but it should be understood that those skilled in the art can made variations and changes therein without departing from the scope of this invention.

I claim:

1. A voltage multiplier circuit, comprising:
    a chain of capacitors $C_i$ (i=1 ... N) connected in series through a chain of transistors $T_j$ (j=1 ... N),
    a transistor $S_i$ (i=1 ... N) for coupling every connection between each capacitor $C_i$ (i=1 ... N) and each transistor $T_j$ (j=1 ... N) to a ground voltage Vss;
    a transistor $D_i$ (i=1 ... N) for coupling every connection between each capacitor $C_i$ and each transistor $T_{j+1}$ to a supply voltage Vdd;
    wherein the first transistor $T_1$ in the chain of transistors $T_j$ has a source/drain connection connected to said supply voltage Vdd; and wherein the last capacitor CN in the chain of capacitors Ci (i=1 . . . N) is connected to an output terminal of the voltage multiplier circuit through an additional transistor T (N+1).

2. The voltage multiplier circuit of claim 1 wherein during a charge phase, transistors Tj (j=1 . . . N) are open and transistors Si and Di (i=1 . . . n) are closed such that capacitors Ci (i=1 . . . N) are charged up to the supply voltage Vdd; and wherein during a discharge phase, transistors Tj (j=1 . . . N) are closed and transistors Si and Di (i=1 . . . N) are open such that capacitors Ci (i=1 . . . N) are serially connected and discharged to the output terminal.

3. The voltage multiplier circuit of claim 2 wherein the transistors Tj (j=1 . . . N) are P-channel MOS transistors and the transistors Si and Di (i=1 . . . N) are N-channel MOS transistors.

4. The voltage multiplier circuit of claim 3 wherein a clock signal is connected to the commonly connected gates of each transistor Tj (j=1 . . . N) and each transistor Si (i=1 . . . N) and the clock signal is connected to the gate of each transistor Di (i=1 . . . N) through a voltage doubler circuit, comprising:

a diode having one terminal connected to the supply voltage Vdd;

a capacitor having one plate connected to the clock signal; and wherein the other terminal of the diode is connected to the other plate of the capacitor and to the gate of each transistor Di (i=1 . . . N).

* * * * *